(12) United States Patent
Yu

(10) Patent No.: US 6,312,998 B1
(45) Date of Patent: Nov. 6, 2001

(54) FIELD EFFECT TRANSISTOR WITH SPACERS THAT ARE REMOVABLE WITH PRESERVATION OF THE GATE DIELECTRIC

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/690,073

(22) Filed: Oct. 16, 2000

(51) Int. Cl.[7] ..................................... H01L 21/336
(52) U.S. Cl. .................. 438/303; 438/304; 438/595; 438/596
(58) Field of Search .................... 438/303, 304, 438/595, 596

(56) References Cited

U.S. PATENT DOCUMENTS

| | | | |
|---|---|---|---|
| 6,150,223 | * 11/2000 | Chern et al. | 438/595 |
| 6,200,858 | * 3/2001 | Kokubu | 438/595 |
| 6,255,703 | * 7/2001 | Hause et al. | 438/303 |
| 6,268,254 | * 7/2001 | Jan et al. | 438/303 |

* cited by examiner

Primary Examiner—Trung Dang
(74) Attorney, Agent, or Firm—Monica H. Choi

(57) ABSTRACT

For fabricating a field effect transistor, a gate structure is formed on a gate dielectric on an active device area of a semiconductor substrate. A liner layer of a non-dielectric material is formed on sidewalls of the gate dielectric, and on a drain extension area and a source extension area of the active device area of the semiconductor substrate. First spacers of dielectric material are formed on the liner layer at sidewalls of the gate structure and over the drain and source extension areas. A contact junction dopant is implanted into exposed regions of the active device area of the semiconductor substrate to form a drain contact junction and a source contact junction. The first spacers of dielectric material are etched using a first type of etching reactant that etches the first spacers but not the liner layer such that the gate dielectric is not exposed to the first type of etching reactant. The liner layer of the non-dielectric material is etched using a second type of etching reactant that etches the liner layer but not the gate structure and the gate dielectric. A first thermal anneal is performed to activate the contact junction dopant within the drain and source contact junctions. After this first thermal anneal, a drain extension junction is formed in the drain extension area and a source extension junction is formed in the source extension area by implantation of an extension junction dopant. In this manner, the drain and source extension junctions are not heated up during the first thermal anneal for activating the contact junction dopant. Thus, transient enhanced diffusion of the extension junction dopant is minimized to maintain the shallow depth of the drain and source extension junctions such that short-channel effects are minimized for the field effect transistor having scaled down dimensions.

14 Claims, 4 Drawing Sheets

FIELD EFFECT TRANSISTOR WITH SPACERS THAT ARE REMOVABLE WITH PRESERVATION OF THE GATE DIELECTRIC

TECHNICAL FIELD

The present invention relates generally to fabrication of field effect transistors having scaled-down dimensions, and more particularly, to fabrication of a field effect transistor with spacers that are removable with preservation of the gate dielectric such that the drain and source extension junctions may be formed after thermal anneal of the drain and source contact junctions.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension junction 104 and a source extension junction 106 formed within an active device area 126 of the semiconductor substrate 102. The drain extension junction 104 and the source extension junction 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be comprised of polysilicon. A gate silicide 120 is formed on the polysilicon gate structure 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the gate structure 118 and the gate dielectric 116. When the spacer 122 is comprised of silicon nitride ($Si_3N_4$), then a spacer liner oxide 124 is deposited as a buffer layer between the spacer 122 and the sidewalls of the gate structure 118 and the gate dielectric 116.

As the dimensions of the MOSFET 100 are scaled down further, such as 50 nm (nanometers) for the gate length of the MOSFET 100 for example, the depth of the drain extension junction 104 and the source extension junction 106 is also scaled down to about 15–30 nm (nanometers). The depth of the drain extension junction 104 and the source extension junction 106 is desired to be small to minimize short-channel effects in the MOSFET 100 as the gate length of the MOSFET 100 is scaled down, as known to one of ordinary skill in the art of integrated circuit fabrication.

Referring to FIG. 2, in the prior art, an extension junction dopant is implanted into exposed regions of the active device area 126 to form the drain extension junction 104 and the source extension junction 106 after formation of the gate structure 118 on the gate dielectric 116. A first thermal anneal process is then performed to activate the extension junction dopant within the drain extension junction 104 and the source extension junction 106. Thermal anneal processes for activating dopants are known to one of ordinary skill in the art of integrated circuit fabrication.

The temperature used during the first thermal anneal process is relatively low in a range of from about 500° Celsius to about 900° Celsius to minimize transient enhanced diffusion of the extension junction dopant within the drain extension junction 104 and the source extension junction 106. When the semiconductor substrate 102 is heated up, transient enhanced diffusion of the extension junction dopant may deepen the drain extension junction 104 and the source extension junction 106 undesirably resulting in increased short-channel effects, as known to one of ordinary skill in the art of integrated circuit fabrication.

Referring to FIG. 3, in the prior art, after formation of the drain extension junction 104 and the source extension junction 106, spacers 122 are formed with the spacer liner 124 at the sidewalls of the gate structure 118. A contact junction dopant is implanted into the exposed regions of the active device area 126 of the semiconductor substrate to form the drain contact junction 108 adjacent the drain extension junction 104 and to form the source contact junction 112 adjacent the source extension junction 106. A second thermal anneal process is then performed to activate the contact junction dopant within the drain contact junction 108 and the source contact junction 112. Thermal anneal processes for activating dopants are known to one of ordinary skill in the art of integrated circuit fabrication.

Deep junctions are desired for the drain contact junction 108 and the source contact junction 112 such that a relatively large size of the drain silicide 110 and the source silicide 114 respectively may be fabricated therein to provide low resistance contact to the drain and the source respectively of the MOSFET 100. Thus, a relatively higher temperature above about 1000° Celsius is used during the second thermal anneal for activating the contact junction dopant within the drain contact junction 108 and the source contact junction 112.

However, the drain extension junction 104 and the source extension junction 106 have already been formed before the second thermal anneal. When the semiconductor substrate 102 is heated up to the relatively high temperature used during the second thermal anneal, transient enhanced diffusion of the extension junction dopant may deepen the drain extension junction 104 and the source extension junction 106 undesirably resulting in increased short-channel effects.

Thus, a mechanism is desired for annealing the contact junction dopant within the drain and source contact junctions 108 and 112 at a relatively high temperature for formation of deep contact junctions 108 and 112 while forming the drain and source extension junctions 104 and 106 with shallow depth for minimizing short channel effects in the MOSFET.

SUMMARY OF THE INVENTION

Accordingly, in a general aspect of the present invention, removable spacers are formed such that the drain and source contact junctions are formed with thermal activation of the contact junction dopant before formation of the drain and source extension junctions.

In one embodiment of the present invention, in a method for fabricating a field effect transistor, a gate structure is formed on a gate dielectric on an active device area of a semiconductor substrate. A liner layer of a non-dielectric material is conformally deposited on any exposed surfaces of the gate structure, of the gate dielectric, and of the active device area of the semiconductor substrate. First spacers of dielectric material are formed on the liner layer of the non-dielectric material at sidewalls of the gate structure and on the liner layer of the non-dielectric material over a drain extension area and a source extension area of the active device area of the semiconductor substrate. Any exposed regions of the liner layer of the non-dielectric material are etched such that the active device area of the semiconductor substrate is exposed except at the drain extension area and the source extension area that are covered by the first spacers.

A contact junction dopant is implanted into exposed regions of the active device area of the semiconductor substrate to form a drain contact junction adjacent the drain extension area and a source contact junction adjacent the source extension area. The first spacers of dielectric material are etched using a first type of etching reactant that substantially etches the dielectric material of the first spacers and that substantially does not etch the non-dielectric material of the liner layer such that the gate dielectric remains encapsulated by the liner layer at the sidewalls of the gate dielectric to be not exposed to the first type of etching reactant during the etching of the first spacers. The liner layer of the non-dielectric material is etched using a second type of etching reactant that substantially etches the non-dielectric material of the liner layer and that substantially does not etch the gate dielectric.

A first thermal anneal is performed at a temperature in a range of from about 1000° Celsius to about 1050° Celsius to activate the contact junction dopant within the drain contact junction and the source contact junction. After activation of the contact junction dopant within the drain contact junction and the source contact junction, an extension junction dopant is implanted into the drain extension area and the source extension area exposed within the active device area of the semiconductor substrate to form a drain extension junction in the drain extension area and a source extension junction in the source extension area. A second thermal anneal at a temperature in a range of from about 500° Celsius to about 900° Celsius is performed to activate the extension junction dopant within the drain extension junction and the source extension junction.

In this manner, the drain extension junction and the source extension junction are formed after the relatively high temperature anneal for activating the contact junction dopant within the drain and source contact junctions. Thus, transient enhanced diffusion of the extension junction dopant is minimized to maintain the shallow depth of the drain extension junction and the source extension junction for minimizing undesired short-channel effects of the field effect transistor.

The present invention may be used to particular advantage when the gate structure is comprised of polysilicon, the gate dielectric is comprised of silicon dioxide ($SiO_2$), when the first spacers are comprised of silicon dioxide ($SiO_2$) or silicon nitride ($Si_3N_4$), and when the liner layer is comprised of titanium nitride (TiN).

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, and 12 refer to elements having similar structure and function.

DETAILED DESCRIPTION

Figure 1:
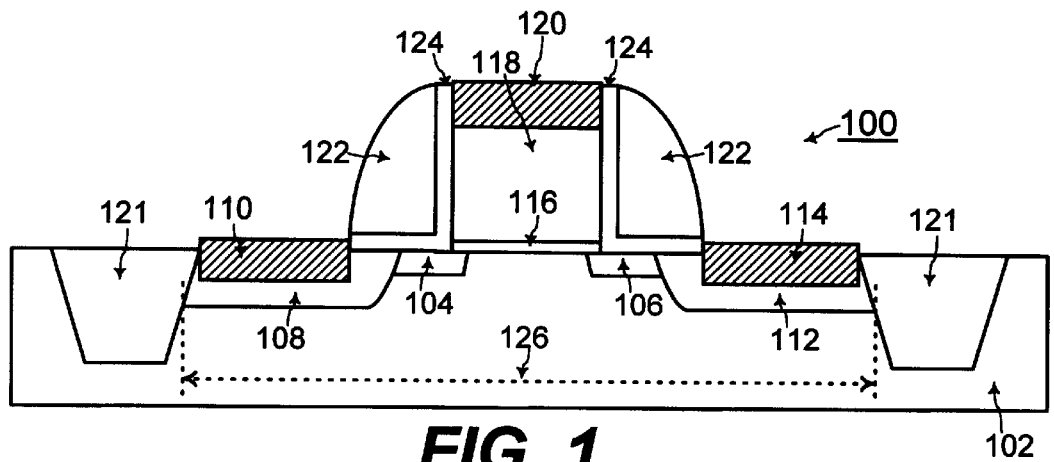
FIG. 1 shows a cross-sectional view of a MOSFET (Metal Oxide Semiconductor Field Effect Transistor)
Figure 2:
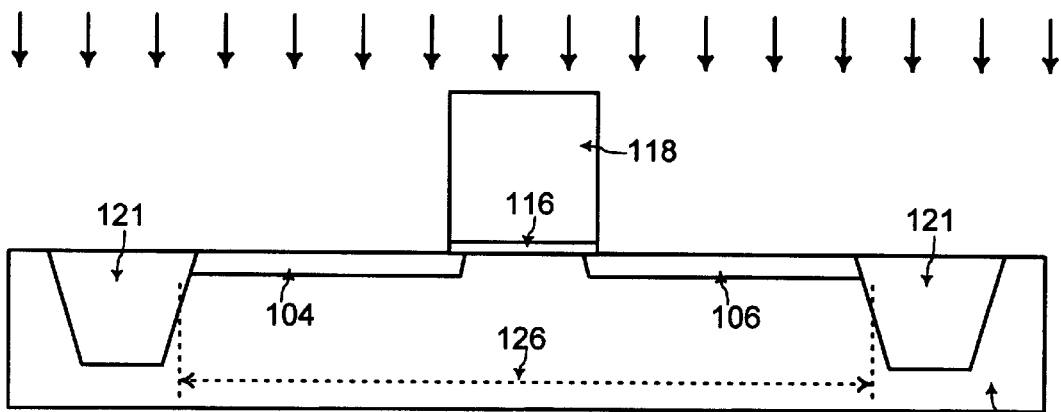
FIGS. 2 and 3 show cross-sectional views for illustrating the steps for forming spacers and the drain and source contact junctions after forming the drain and source extension junctions, according to the prior art.
Figure 3:
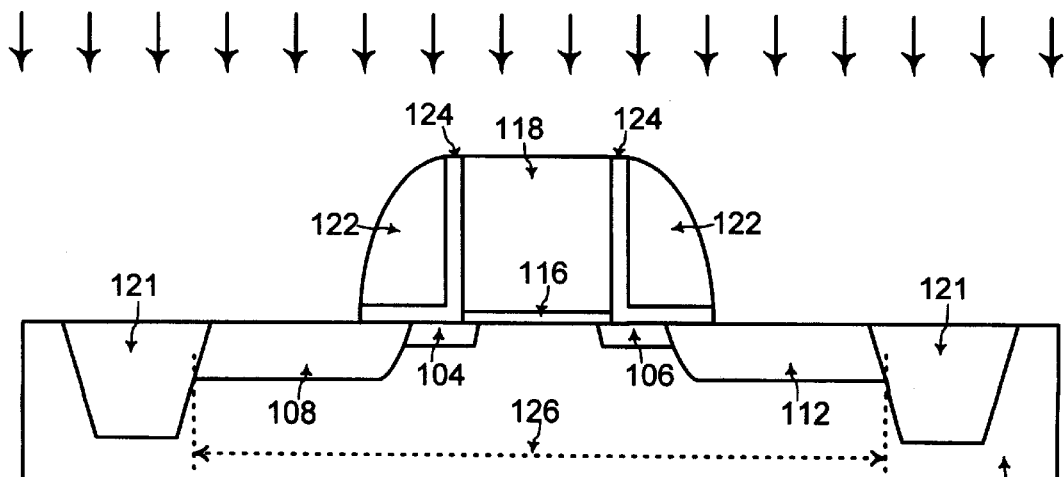
Figure 4:
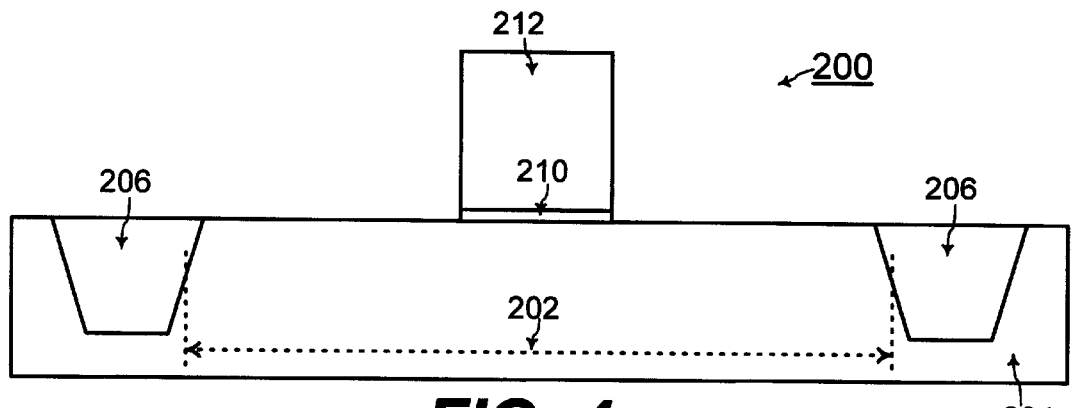
FIGS. 4, 5, 6, 7, 8, 9, 10, 11, and 12 show cross-sectional views for illustrating the steps for forming a removable spacer with preservation of the gate dielectric such that the drain and source extension junctions may be formed after formation of the drain and source contact junctions and after thermal anneal of the contact junction dopant within the drain and source contact junctions, according to an embodiment of the present invention.

In the cross-sectional view of FIG. 4, an active device area 202 is formed in a semiconductor substrate 204 by STI (shallow trench isolation) structures 206. The semiconductor substrate 204 may be comprised of silicon in one embodiment of the present invention. STI (shallow trench isolation) technology for electrical isolation of an active device area is known to one of ordinary skill in the art of integrated circuit fabrication.

For formation of a MOSFET 200 according to an aspect of the present invention, a gate dielectric 210 and a gate structure 212 are formed within the active device area 202 on the semiconductor substrate 204. The gate dielectric 210 may be comprised of silicon dioxide ($SiO_2$) or a dielectric material with a low dielectric constant, as known to one of ordinary skill in the art of integrated circuit fabrication. The gate structure 212 may be comprised of a semiconductor material such as polysilicon, in one embodiment of the present invention. The gate length of the gate dielectric 210 and the gate structure 212 may be in a range of from about 25 nm (nanometers) to about 200 nm (nanometers), and the height of the gate structure may be in a range of from about 100 nm (nanometers) to about 200 nm (nanometers). Processes for deposition and etching of such material for the gate dielectric 210 and the gate structure 212 are known to one of ordinary skill in the art of integrated circuit fabrication.

Figure 5:
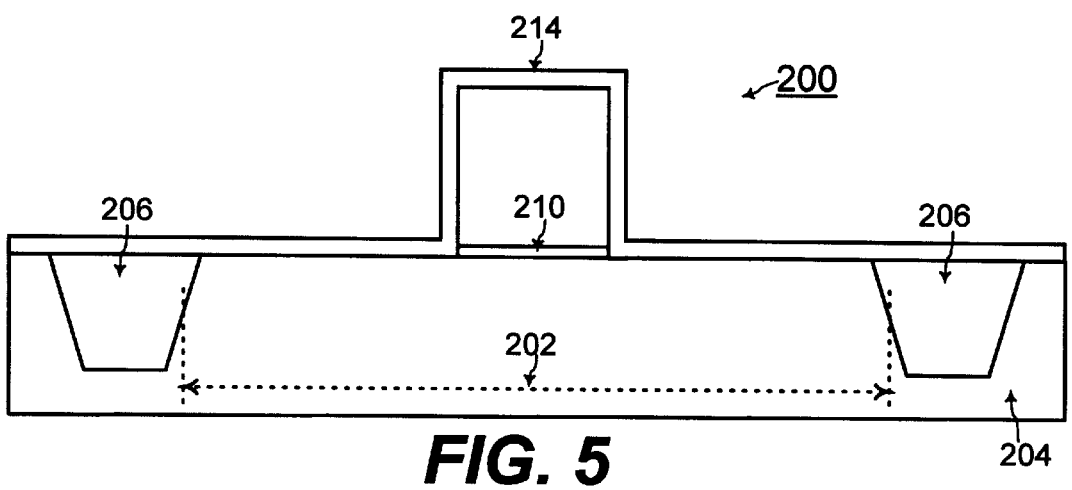

Referring to FIG. 5, a liner layer 214 of non-dielectric material is conformally deposited on any exposed surfaces of the gate structure 212, the gate dielectric 210, and the active device area 202 of the semiconductor substrate 204. In one embodiment of the present invention, the non-dielectric material of the liner layer 214 is titanium nitride (TiN) having a thickness in a range of from about 100 Å (angstroms) to about 200 Å (angstroms). Processes for conformal deposition of such a liner layer 214 are known to one of ordinary skill in the art of integrated circuit fabrication.

Figure 6:
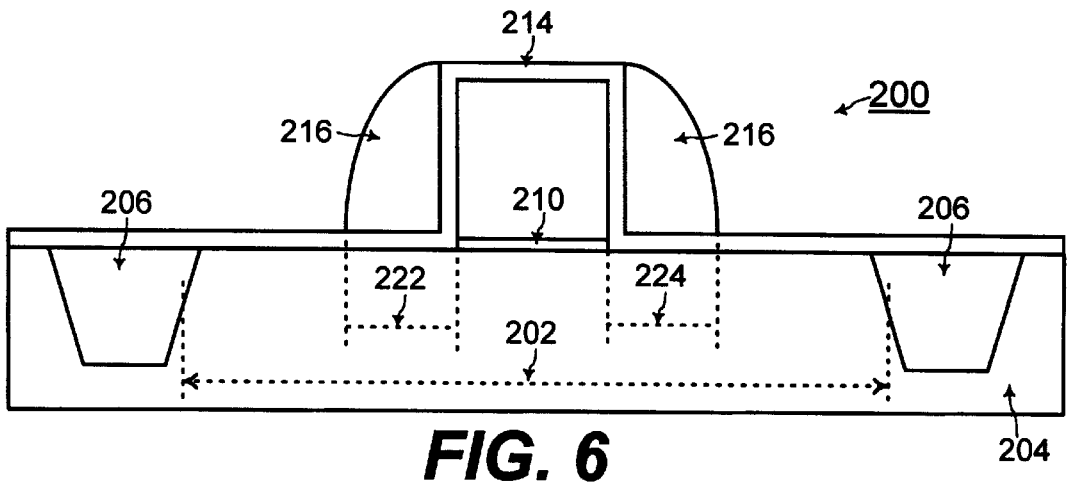

Referring to FIG. 6, first spacers 216 are formed on the liner layer 214 at the sidewalls of the gate structure 212 and over a drain extension area 222 and a source extension area 224 within the active device area 202 of the semiconductor substrate 204. The first spacers 216 may be comprised of silicon dioxide ($SiO_2$) or silicon nitride ($Si_3N_4$) and are typically formed by deposition of such material and anisotropic etching.

During anisotropic etching of the silicon dioxide ($SiO_2$) or silicon nitride ($Si_3N_4$) for formation of the first spacers 216, the liner layer 214 encapsulates the gate structure 214, the gate dielectric 210, and the active device area 202 of the semiconductor substrate 204. A first type of etching reactant such as hydrofluoric acid (HF) or phosphoric acid ($H_3PO_4$) that substantially etches dielectric material such as silicon dioxide ($SiO_2$) or silicon nitride ($Si_3N_4$) but that substantially does not etch titanium nitride (TiN) of the liner layer 214 is used for anisotropically etching of the silicon dioxide ($SiO_2$) or silicon nitride ($Si_3N_4$) for formation of the first spacers 216. Because the liner layer 214 encapsulates the gate structure 214, the gate dielectric 210, and the active device area 202 of the semiconductor substrate 204, such regions are not etched during etching of the silicon dioxide ($SiO_2$) or silicon nitride ($Si_3N_4$) for formation of the first spacers 216. Processes for formation of the first spacers 216 are known to one of ordinary skill in the art of integrated circuit fabrication.

Figure 7:
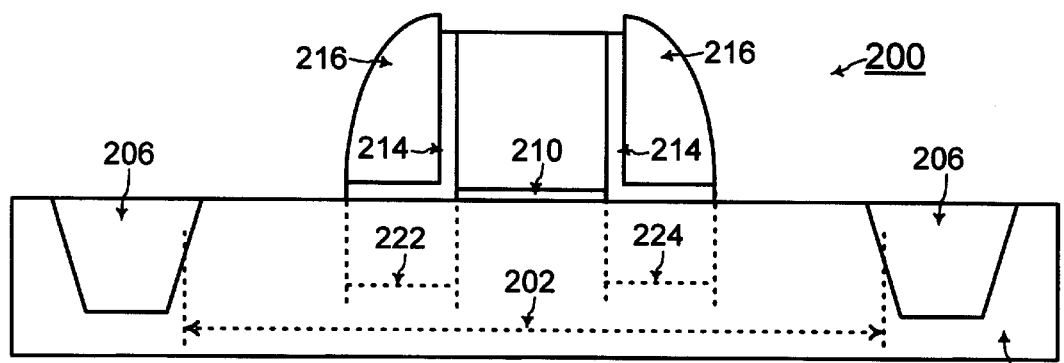

Referring to FIG. 7, any exposed regions of the liner layer 214 are etched away. A second type of etching reactant comprised of ammonium hydroxide ($NH_4OH$) and hydrogen peroxide ($H_2O_2$), for example, that substantially etches the titanium nitride (TiN) of the liner layer 214 but that substantially does not etch the dielectric material of the first spacers 216 is used for etching the exposed regions of the liner layer 214. Processes for etching away exposed regions of the liner layer 214 of titanium nitride (TiN) are known to one of ordinary skill in the art of integrated circuit fabrication.

Figure 8:
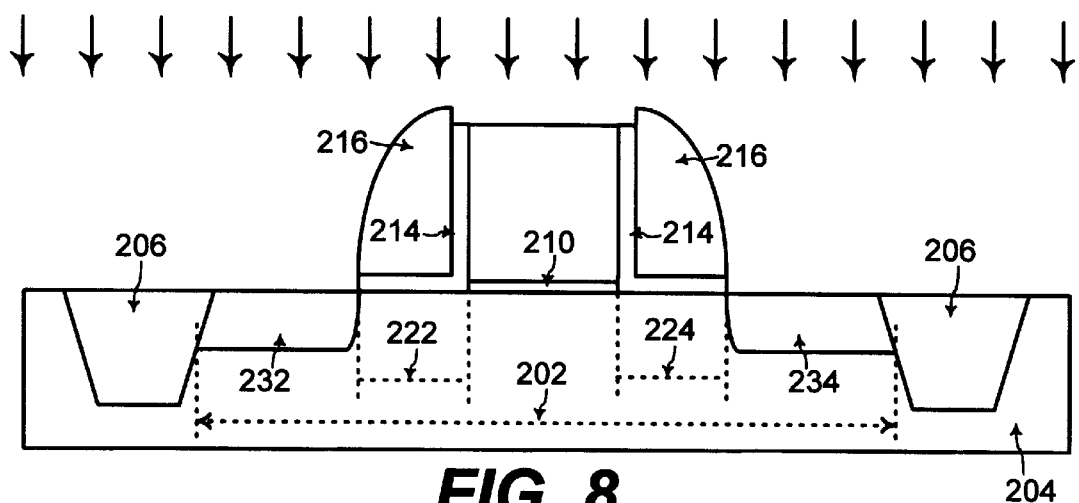

Referring to FIG. 8, the liner layer 214 remains on the sidewalls of the gate structure 212 and the gate dielectric 210, and the first spacers 216 cover the drain extension area 222 and the source extension area 224. A contact junction dopant is implanted into exposed regions of the active device area 202 of the semiconductor substrate 204 to form a drain contact junction 232 adjacent the drain extension area 222 and to form a source contact junction 234 adjacent the source extension area 224.

The contact junction dopant is an N-type dopant for forming the drain contact junction 232 and the source contact junction 234 of an NMOSFET (N-channel Metal Oxide Semiconductor Field Effect Transistor). Alternatively, the contact junction dopant is a P-type dopant for forming the drain contact junction 232 and the source contact junction 234 of a PMOSFET (P-channel Metal Oxide Semiconductor Field Effect Transistor).

The contact junction dopant is implanted relatively deep into the semiconductor substrate 204 to form deep junctions for the drain and source contact junctions 232 and 234. The drain and source contact junctions 232 and 234 are desired to be deep junctions such that a relatively large size of the drain silicide and the source silicide respectively may be fabricated therein to provide low resistance contact to the drain and the source respectively of the MOSFET 200. Processes for implantation of the contact junction dopant for formation of the drain contact junction 232 and the source contact junction 234 are known to one of ordinary skill in the art of integrated circuit fabrication.

Figure 9:
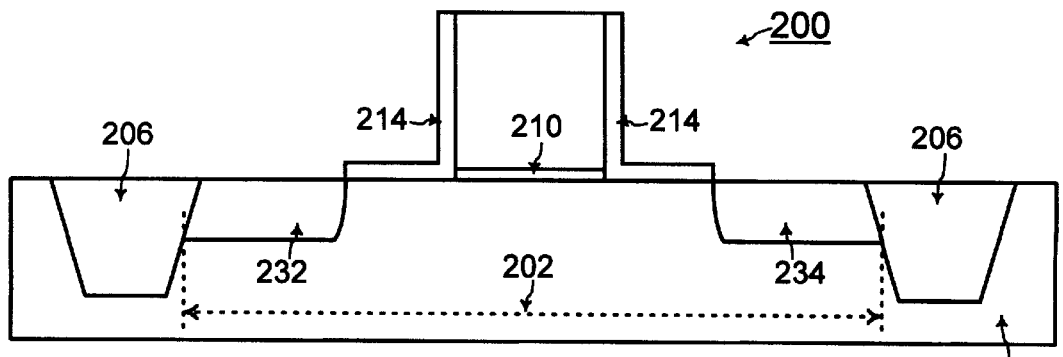

Referring to FIG. 9, after implantation of the contact junction dopant for formation of the drain and source contact junctions 232 and 234, the first spacers 216 are etched way using the first type of etching reactant such as hydrofluoric acid (HF) or phosphoric acid ($H_3PO_4$) that substantially etches dielectric material such as silicon dioxide ($SiO_2$) or silicon nitride ($Si_3N_4$) but that substantially does not etch titanium nitride (TiN) of the liner layer 214. Because the liner layer 214 encapsulates the gate dielectric 210 at the sidewalls of the gate dielectric 210, the gate dielectric is not etched during etching of the first spacers 216. Thus, the integrity of the gate dielectric 210 is preserved by the encapsulating liner layer 214. Processes for etching away the first spacers 216 are known to one of ordinary skill in the art of integrated circuit fabrication.

Figure 10:
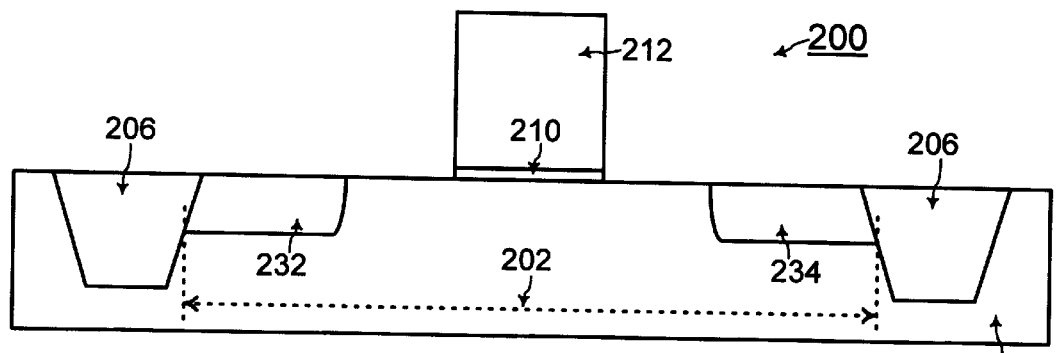

Referring to FIG. 10, the liner layer 214 of titanium nitride (TiN) is etched away using the second type of etching reactant comprised of ammonium hydroxide ($NH_4OH$) and hydrogen peroxide ($H_2O_2$), for example, that substantially etches the titanium nitride (TiN) of the liner layer 214 but that substantially does not etch the dielectric material of the gate dielectric 210. Processes for etching away the liner layer 214 of titanium nitride (TiN) are known to one of ordinary skill in the art of integrated circuit fabrication.

At any point after implantation of the contact junction dopant for formation of the drain and source contact junctions 232 and 234 (i.e., after FIGS. 8, 9, or 10), a first thermal anneal is performed to activate the contact junction dopant within the drain and source contact junctions 232 and 234. The drain and source contact junctions 232 and 234 are desired to be deep junctions such that a relatively large size of the drain silicide and the source silicide respectively may be fabricated therein to provide low resistance contact to the drain and the source respectively of the MOSFET 200. Thus, a relatively high temperature in a range of from about 1000° Celsius to about 1050° Celsius is used in the first thermal anneal for activating the contact junction dopant within the drain and source contact junctions 232 and 234. Thermal anneal processes for activation of dopant within a junction are known to one of ordinary skill in the art of integrated circuit fabrication.

Figure 11:
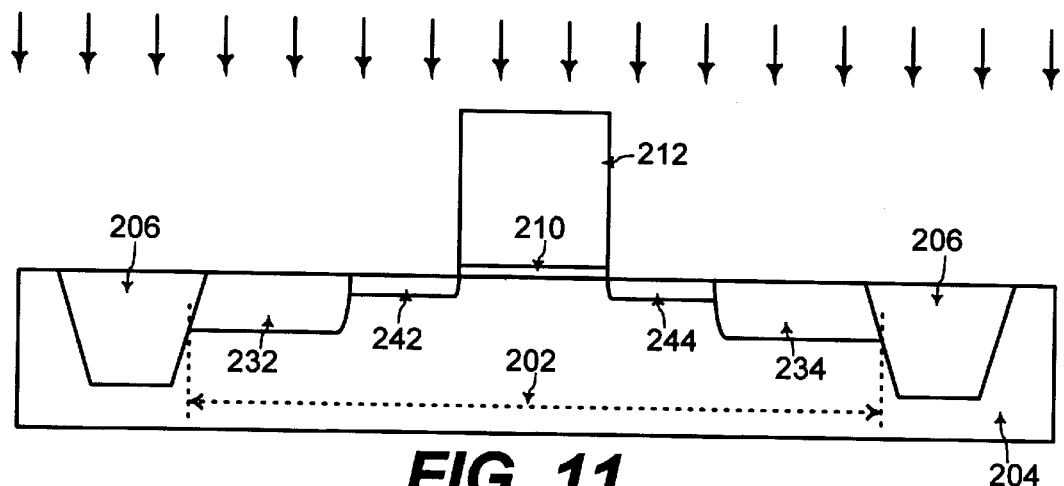

Referring to FIG. 11, after the first thermal anneal for activating the contact junction dopant within the drain and source contact junctions 232 and 234, an extension junction dopant is implanted into exposed regions of the active device area 202 of the semiconductor substrate 204 to form a drain extension junction 242 in the drain extension area 222 and to form a source extension junction 244 in the source extension area 224. The extension junction dopant is an N-type dopant for forming the drain extension junction 242 and the source extension junction 244 of an NMOSFET (N-channel Metal Oxide Semiconductor Field Effect Transistor). Alternatively, the extension junction dopant is a P-type dopant for forming the drain extension junction 242 and the source extension junction 244 of a PMOSFET (P-channel Metal Oxide Semiconductor Field Effect Transistor).

The extension junction dopant is implanted relatively shallow into the semiconductor substrate 204 to form shallow junctions for the drain and source extension junctions 242 and 244. The drain and source extension junctions 242 and 244 are desired to be relatively shallow junctions to minimize short channel effects in the MOSFET 200. Processes for implantation of the extension junction dopant for formation of the drain extension junction 242 and the source extension junction 244 are known to one of ordinary skill in the art of integrated circuit fabrication.

A second thermal anneal is performed to activate the extension junction dopant within the drain and source extension junctions 242 and 244. The drain and source extension junctions 242 and 244 are desired to be relatively shallow junctions to minimize short channel effects in the MOSFET 200. To minimize transient enhanced diffusion of the extension junction dopant within the drain and source extension junctions 242 and 244, a relatively low temperature in a range of from about 500° Celsius to about 900° Celsius is used during this second thermal anneal for activating the extension junction dopant within the drain and source extension junctions 242 and 244.

Figure 12:
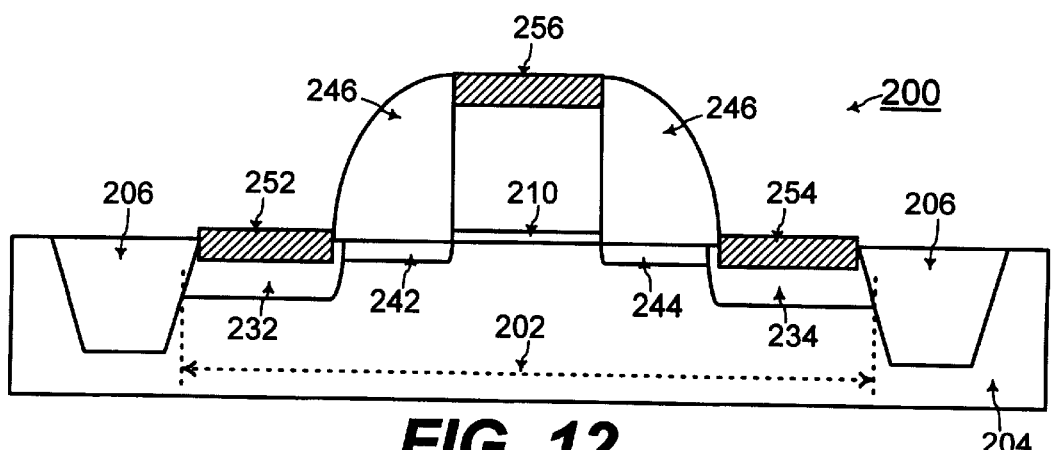

Referring to FIG. 12, second spacers 246 are formed on the sidewalls of the gate structure 212 and the gate dielectric 210 after formation of the drain and source extension junctions 242 and 244. In addition, a drain silicide 252 is formed with the drain contact junction 232 for providing contact to the drain of the MOSFET 200, and a source silicide 254 is formed with the source contact junction 234 for providing contact to the source of the MOSFET 200. Furthermore, a gate silicide 256 is formed with the polysilicon of the gate structure 212. Such silicides may be comprised of one of cobalt silicide ($CoSi_2$) or titanium silicide ($TiSi_2$) for example, and processes for formation of such silicides are known to one of ordinary skill in the art of integrated circuit fabrication.

In this manner, the removable first spacers 216 and the liner layer 214 are used such that the drain and source extension junctions 242 and 244 are formed after formation of the drain and source contact junctions 232 and 234. The thermal anneal for activating the contact junction dopant within the drain and source contact junctions 232 and 234 is also performed before the formation of the drain and source extension junctions 242 and 244 to minimize transient enhanced diffusion of the extension junction dopant within the drain and source extension junctions 242 and 244. Thus, the depth of the drain and source extension junctions 242 and 244 is minimized to in turn minimize the short-channel effects of the MOSFET 200.

The foregoing is by way of example only and is not intended to be limiting. For example, any specified material or any specified dimension of any structure described wherein is by way of example only. In addition, as will be understood by those skilled in the art, the structures described herein may be made or used in the same way regardless of their position and orientation. Accordingly, it is to be understood that terms and phrases such as "over," "sidewall," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor having a gate structure on a gate dielectric within an active device area of a semiconductor substrate, the method including the steps of:
   A. conformally depositing a liner layer of a non-dielectric material on any exposed surfaces of said gate structure, of said gate dielectric, and of said active device area of said semiconductor substrate;
   B. forming first spacers of dielectric material on said liner layer of said non-dielectric material at sidewalls of said gate structure and on said liner layer of said non-dielectric material over a drain extension area and a source extension area of said active device area of said semiconductor substrate;
   C. etching any exposed regions of said liner layer of said non-dielectric material such that said active device area of said semiconductor substrate is exposed except at said drain extension area and said source extension area that are covered by said first spacers;
   D. implanting a contact junction dopant into exposed regions of said active device area of said semiconductor substrate to form a drain contact junction adjacent said drain extension area and a source contact junction adjacent said source extension area;
   E. etching said first spacers of dielectric material using a first type of etching reactant that substantially etches said dielectric material of said first spacers and that substantially does not etch said non-dielectric material of said liner layer such that said said gate dielectric remains encapsulated at sidewalls of said gate dielectric by said liner layer to be not exposed to said first type of etching reactant during said etching of said first spacers; and
   F. etching said liner layer of said non-dielectric material using a second type of etching reactant that substantially etches said non-dielectric material of said liner layer and that substantially does not etch said gate dielectric.

2. The method of claim 1, further including the step of:
   G. performing a first thermal anneal at a temperature in a range of from about 1000° Celsius to about 1050° Celsius to activate said contact junction dopant within said drain contact junction and said source contact junction.

3. The method of claim 2, further including the step of:
   H. implanting an extension junction dopant into said drain extension area and said source extension area exposed within said active device area of said semiconductor substrate to form a drain extension junction in said drain extension area and a source extension junction in said source extension area, after said step G.

4. The method of claim 3, wherein said contact junction dopant and said extension junction dopant are N-type dopants for fabrication of an NMOSFET (N-channel Metal Oxide Semiconductor Field Effect Transistor).

5. The method of claim 3, wherein said contact junction dopant and said extension junction dopant are P-type dopants for fabrication of a PMOSFET (P-channel Metal Oxide Semiconductor Field Effect Transistor).

6. The method of claim 3, further including the step of:
   I. performing a second thermal anneal at a temperature in a range of from about 500° Celsius to about 900° Celsius to activate said extension junction dopant within said drain extension junction and said source extension junction.

7. The method of claim 6, further including the step of:
   J. forming second spacers on said sidewalls of said gate structure and said gate dielectric and on said drain extension junction and said source extension junction.

8. The method of claim 7, wherein said semiconductor substrate is comprised of silicon, and wherein said gate structure is comprised of polysilicon.

9. The method of claim 8, further including the steps of:
   K. forming a drain silicide within said drain contact junction;
   L. forming a source silicide within said source contact junction; and M. forming a gate silicide within said gate structure.

10. The method of claim 1, wherein said first spacers are comprised of one of silicon dioxide ($SiO_2$) or silicon nitride ($Si_3N_4$).

11. The method of claim 10, wherein said first type of etching reactant for etching said first spacers is comprised of hydrofluoric (HF) acid when said first spacers are comprised of silicon dioxide ($SiO_2$), and wherein said first type of etching reactant for etching said first spacers is comprised of phosphoric ($H_3PO_4$) acid when said first spacers are comprised of silicon nitride ($Si_3N_4$).

12. The method of claim 1, wherein said liner layer is comprised of titanium nitride (TiN).

13. The method of claim 12, wherein said second type of etching reactant is comprised of ammonium hydroxide ($NH_4OH$) and hydrogen peroxide ($H_2O_2$).

14. A method for fabricating a MOSFET (Metal Oxide Semiconductor Field Effect Transistor) having a gate structure on a gate dielectric within an active device area of a semiconductor substrate, the method including the steps of:

A. conformally depositing a liner layer comprised of titanium nitride (TiN) on any exposed surfaces of said gate structure, of said gate dielectric, and of said active device area of said semiconductor substrate;

B. forming first spacers of dielectric material on said liner layer at sidewalls of said gate structure and on said liner layer over a drain extension area and a source extension area of said active device area of said semiconductor substrate, wherein said first spacers are comprised of one of silicon dioxide ($SiO_2$) or silicon nitride ($Si_3N_4$);

C. etching any exposed regions of said liner layer such that said active device area of said semiconductor substrate is exposed except at said drain extension area and said source extension area that are covered by said first spacers;

D. implanting a contact junction dopant into exposed regions of said active device area of said semiconductor substrate to form a drain contact junction adjacent said drain extension area and a source contact junction adjacent said source extension area;

E. etching said first spacers of dielectric material using a first type of etching reactant that substantially etches said dielectric material of said first spacers and that substantially does not etch said titanium nitride (TiN) of said liner layer such that said gate dielectric remains encapsulated by said liner layer at sidewalls of said gate dielectric to be not exposed to said first type of etching reactant during said etching of said first spacers;

wherein said first type of etching reactant for etching said first spacers is comprised of hydrofluoric (HF) acid when said first spacers are comprised of silicon dioxide ($SiO_2$), and wherein said first type of etching reactant for etching said first spacers is comprised of phosphoric ($H_3PO_4$) acid when said first spacers are comprised of silicon nitride ($Si_3N_4$);

F. etching said liner layer of titanium nitride (TiN) using a second type of etching reactant that substantially etches said titanium nitride (TiN) of said liner layer and that substantially does not etch said gate dielectric, wherein said second type of etching reactant is comprised of ammonium hydroxide ($NH_4OH$) and hydrogen peroxide ($H_2O_2$);

G. performing a first thermal anneal at a temperature in a range of from about 1000° Celsius to about 1050° Celsius to activate said contact junction dopant within said drain contact junction and said source contact junction;

H. implanting an extension junction dopant into said drain extension area and said source extension area exposed within said active device area of said semiconductor substrate to form a drain extension junction in said drain extension area and a source extension junction in said source extension area, after said step G;

wherein said contact junction dopant and said extension junction dopant are N-type dopants for fabrication of an NMOSFET (N-channel Metal Oxide Semiconductor Field Effect Transistor);

wherein said contact junction dopant and said extension junction dopant are P-type dopants for fabrication of a PMOSFET (P-channel Metal Oxide Semiconductor Field Effect Transistor);

I. performing a second thermal anneal at a temperature in a range of from about 500° Celsius to about 900° Celsius to activate said extension junction dopant within said drain extension junction and said source extension junction;

J. forming second spacers on said sidewalls of said gate structure and said gate dielectric and on said drain extension junction and said source extension junction;

wherein said semiconductor substrate is comprised of silicon, and wherein said gate structure is comprised of polysilicon;

K. forming a drain silicide within said drain contact junction;

L. forming a source silicide within said source contact junction; and

M. forming a gate silicide within said gate structure.

* * * * *